(12) United States Patent
Kugiyama et al.

(10) Patent No.: US 10,068,883 B2
(45) Date of Patent: Sep. 4, 2018

(54) OPTICAL COUPLING DEVICE

(71) Applicant: KABUSHIKI KAISHA TOSHIBA, Tokyo (JP)

(72) Inventors: Yuta Kugiyama, Buzen Fukuoka (JP); Hisami Saito, Kitakyushu Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 15/061,996

(22) Filed: Mar. 4, 2016

(65) Prior Publication Data

US 2017/0040305 A1 Feb. 9, 2017

(30) Foreign Application Priority Data

Aug. 3, 2015 (JP) ................................. 2015-153533

(51) Int. Cl.
*H01L 25/16* (2006.01)
*H01L 31/02* (2006.01)
*H01L 33/62* (2010.01)
*H01L 31/167* (2006.01)

(52) U.S. Cl.
CPC .......... *H01L 25/167* (2013.01); *H01L 25/165* (2013.01); *H01L 31/02005* (2013.01); *H01L 31/167* (2013.01); *H01L 33/62* (2013.01); H01L 2224/05554 (2013.01); H01L 2224/48091 (2013.01); H01L 2224/48137 (2013.01); H01L 2224/48247 (2013.01); H01L 2224/8592 (2013.01); H01L 2924/181 (2013.01)

(58) Field of Classification Search
CPC .................................................... H01L 25/167
See application file for complete search history.

(56) References Cited

U.S. PATENT DOCUMENTS

| | | | | |
|---|---|---|---|---|
| 7,026,654 | B2* | 4/2006 | Igaki | H01L 31/02325 257/13 |
| 7,235,804 | B2* | 6/2007 | Aki | H01L 27/15 250/551 |
| 2008/0159691 | A1* | 7/2008 | Aki | H01L 31/173 385/24 |
| 2010/0272388 | A1* | 10/2010 | Im | G02B 6/4201 385/14 |
| 2013/0087811 | A1* | 4/2013 | Takeshita | H01L 31/18 257/80 |
| 2014/0084305 | A1 | 3/2014 | Fujimoto et al. | |

FOREIGN PATENT DOCUMENTS

| | | |
|---|---|---|
| JP | 2004253534 A | 9/2004 |
| JP | 2012248742 A | 12/2012 |
| JP | 2015056531 A | 3/2015 |

* cited by examiner

*Primary Examiner* — Eugene Lee
(74) *Attorney, Agent, or Firm* — Patterson & Sheridan, LLP

(57) ABSTRACT

An optical coupling device includes a first receiving chip having a first region on one end and a second region on another end side. A first emitting chip is disposed on the first region. A second receiving chip has a third region on one end and a fourth region on another end. A second emitting chip is disposed on the fourth region. The first and third regions are adjacent, and the second and fourth regions are adjacent. A first connection portion is disposed on the second region and is electrically connected to the second light emitting chip through a bonding wire. A second connection portion is disposed in the third region and is electrically connected to the first light emitting chip through a bonding wire.

20 Claims, 7 Drawing Sheets

OPTICAL COUPLING DEVICE

CROSS-REFERENCE TO RELATED APPLICATION

This application is based upon and claims the benefit of priority from Japanese Patent Application No. 2015-153533, filed Aug. 3, 2015, the entire contents of which are incorporated herein by reference.

FIELD

Embodiments described herein relate generally to an optical coupling device.

BACKGROUND

There have been known optical coupling devices including a plurality of optical coupling sets, the sets each having a light-emitting element and a light-receiving element paired with each other within one package.

Such an optical coupling device has a tendency to cause so-called crosstalk in which light from one optical coupling set is received by the light-receiving element of another optical coupling set. In such instances, a signal is erroneously transmitted. The crosstalk can be prevented by separating the light-receiving elements of different sets from each other or providing a light shielding member between the light-receiving elements of different sets; however, an increase the overall size of the device package will tend to be required to accommodate such additional spacing between elements and/or shielding members.

In addition, when distance between the light-receiving elements is increased, a bonding wire used within the optical coupling device may become longer depending on the arrangement of the light-emitting elements and the light-receiving elements, which may result in a greater tendency for the bonding wire to become detached and/or a short circuit.

DETAILED DESCRIPTION

In general, according to one embodiment, an optical coupling device includes a first light receiving chip having a first upper surface and a first side surface. The first upper surface has a first region on a first end portion and a second region on a second end portion that is opposite the first end portion in a first direction. A second light receiving chip has a second upper surface and a second side surface. The second upper surface has a third region on a first end portion and a fourth region on a second end portion that is opposite the first end portion in the first direction. The third region is adjacent the first region in a second direction crossing the first direction. The first and second side surfaces are facing each other in the second direction. A first light emitting chip is disposed on the first region. A second light emitting chip is disposed on the fourth region. A first connection portion (e.g., a wire bonding pad or the like) is disposed on the second region and is electrically connected to the second light emitting chip through a bonding wire. A second connection portion is disposed on the third region and electrically connected to the first light emitting chip through a bonding wire.

In general, according to another embodiment, an optical coupling device includes a first light receiving chip that includes a first upper surface having a first region on one end side and a second region on the other end side and a first side surface, a second light receiving chip that includes a second upper surface having a third region on one end side and a fourth region on the other end side, and a second side surface, the third region being lined up with the first region in a first direction and the second side surface being arranged to face the first side surface, a first light emitting chip that is provided in the first region, a second light emitting chip that is provided in the fourth region, a first connection portion that is arranged in the second region and is electrically connected to the second light emitting chip through a bonding wire, and a second connection portion that is arranged in the third region and is electrically connected to the first light emitting chip through a bonding wire. Here, "a connection portion" is a location on or a region of a chip or chip package where one or more terminals and/or wire bonding pads for making external electrical connections are provided. Here, "a wire connection portion" is a specific position or region on a chip or chip package at which an electrical contact can be made to elements in the chip or chip package by for example a bonding wire. For example, a "wire connection portion" may be a wire bonding pad or the like.

Hereinafter, an embodiment will be described with reference to the accompanying drawings.

Figure 1:
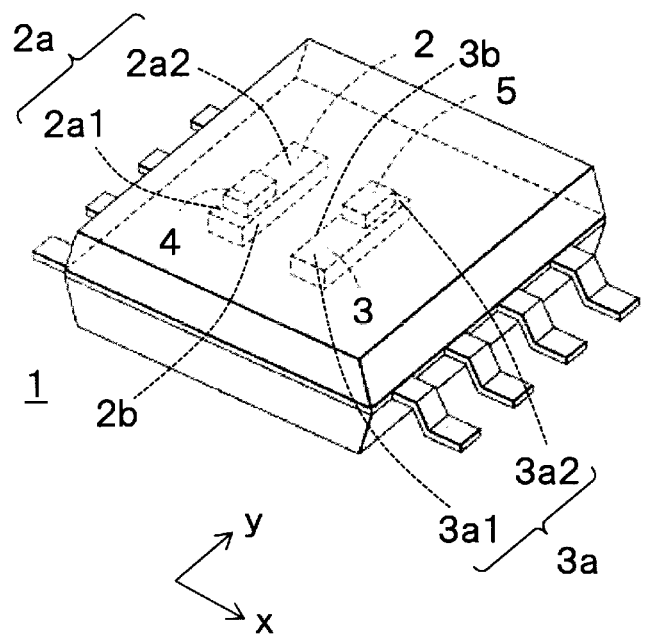
FIG. 1 is a perspective view of an optical coupling device according to an embodiment.
Figure 2:
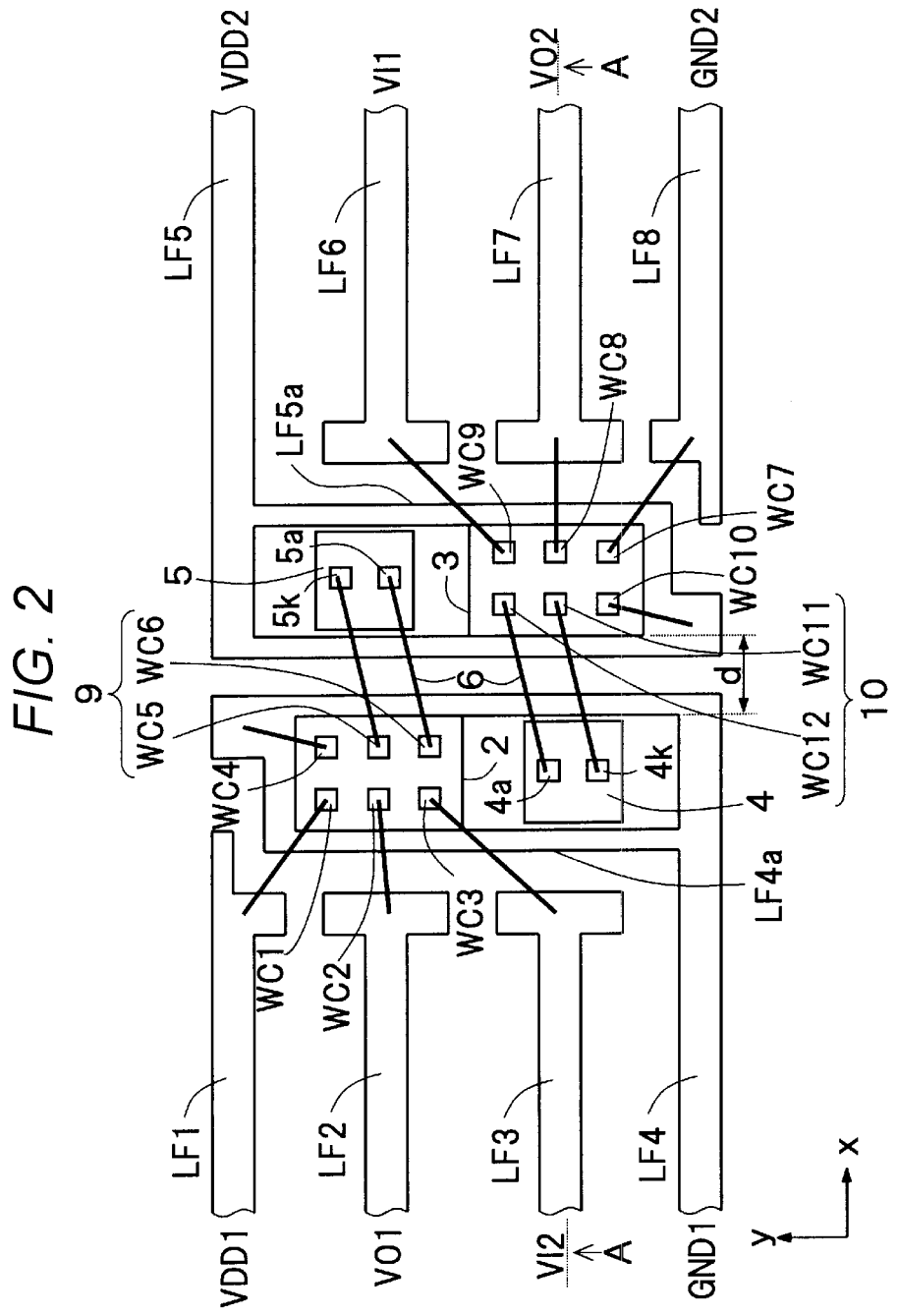
FIG. 2 is a diagram illustrating a layout of the optical coupling device.

FIG. 1 is a perspective view of an optical coupling device according to an embodiment, and FIG. 2 is a diagram illustrating a layout of the optical coupling device 1. As illustrated in FIGS. 1 and 2, the optical coupling device 1 according to the present embodiment includes first and second light receiving chips 2 and 3 each having a rectangular shape, a first light emitting chip 4 arranged on the first light receiving chip 2, and a second light emitting chip 5 arranged on the second light receiving chip 3.

The first light emitting chip 4 and the second light emitting chip 5 may each comprise a single light-emitting element, such as a light emission diode (LED), or may each be single-packaged semiconductor device including a substrate on which a light-emitting element is mounted and a substrate on which a peripheral circuit for operating the light-emitting element is mounted. The first light receiving chip 2 and the second light receiving chip 3 are semiconductor devices in which a light-receiving element such as a photodiode is embedded. The first light emitting chip 4 is arranged on the first light receiving chip 2 by making the light emitting surface thereof face a light receiving surface located on the upper surface of the first light receiving chip 2. Similarly, the second light emitting chip 5 is arranged on the second light receiving chip 3 by making the light emitting surface thereof face a light receiving surface located at the upper surface of the second light receiving chip 3.

Light from the light emitting surface of the first light emitting chip 4 projects downward and is received by the light receiving surface of the first light receiving chip 2. Similarly, light from the light emitting surface of the second light emitting chip 5 projects downward and is received by the light receiving surface of the second light receiving chip 3. The light emitting surface of the first light emitting chip 4 and the light receiving surface of the first light receiving chip 2 are attached to each other using, for example, a transparent adhesive obtained by hardening a transparent silicone paste. The same is true of attachment between the second light emitting chip 5 and the second light receiving chip 3. Here, the term "transparent" as used herein refers to being transmissive with respect to a wavelength of light emitted from the first light emitting chip 4.

In FIGS. 1 and 2, chips 2 and 3 have a rectangular shape. A narrow direction of each of the first and second light receiving chips 2 and 3 is set to be a first direction x, and a wide direction thereof is set to be a second direction y. That is, the short-side edges of chips 2 and 3 extend along the first direction x and the long-side edges of chips 2 and 3 extend along the second direction y.

As illustrated in FIG. 1, the first light receiving chip 2 includes a first upper surface 2a having a first region 2a1 on a first end in the second direction y and a second region 2a2 on a second end opposite the first end in the second direction y. The first light receiving chip 2 also includes a first side surface 2b in a plane which intersects a plane of the first upper surface 2a.

The second light receiving chip 3 includes a second upper surface 3a having a third region 3a1 on a first end in the second direction y and a fourth region 3a2 on a second end opposite the first end in the second direction y. The second light receiving chip also includes a second side surface 3b in a plane which intersects a plane of the second upper surface 3a.

As depicted in FIG. 1, the third region 3a1 is aligned with the first region 2a1 in the first direction x, and the second side surface 3b is arranged so as to face the first side surface 2b in the first direction x. The first light emitting chip 4 is provided on the first region 2a1, and the second light emitting chip 5 is provided on the fourth region 3a2.

As illustrated in FIG. 2, the first light receiving chip 2 includes a first connection portion 9, portions of which are arranged in the second region 2a2. The first light receiving chip 2 is connected to the second light emitting chip 5 through bonding wire(s) 6 contacting a portion of connection portion 9. The first connection portion 9 is arranged on an end of the first light receiving chip 2 that is adjacent to an end of the second light receiving chip 3 on which the second light emitting chip 5 is disposed, and thus it is possible to reduce the length of the bonding wire 6 used for connecting the first connection portion 9 and the second light emitting chip 5.

Similarly, the second light receiving chip 3 includes a second connection portion 10, portions of which are arranged in the third region 3a1. The second light receiving chip 3 is connected to the first light emitting chip 4 through bonding wires(s) 6 contacting a portion of connection portion 10. The second connection portion 10 is adjacent to first light emitting chip 4 in the first direction x, and thus it is possible to reduce the length of the bonding wire 6 used for connecting the second connection portion 10 and the first light emitting chip 4.

The first light receiving chip 2 is mounted on a wide portion LF4a of a lead frame LF4. The wide portion LF4a extends in the second direction y from a terminal end portion of LF4 which extends in the first direction x. Similarly, the second light receiving chip 3 is mounted on a wide portion LF5a of a lead frame LF5. The wide portion LF5a which extends in the second direction y from a terminal end portion of LF5 which extends in the first direction x.

The wide portions LF4a and LF5a are arranged in proximity to each other in the first direction x and are substantially parallel to each other in the second direction y.

The first light receiving chip 2 and the second light receiving chip 3 are mounted on the wide portions LF4a and LF5a, and thus the first and second side surfaces 2b and 3b of the respective first and second light receiving chips 2 and 3 face each other in the first direction x across the separation/gap between wide portions LF4a and LF5a. Hereinafter, an interval between the first and second side surfaces 2b and 3b is referred to as an interval d between the first light receiving chip 2 and the second light receiving chip 3. The interval d is at least (and generally greater than) the spacing distance in the first direction x between the wide portions LF4a and LF5a.

Figure 3:
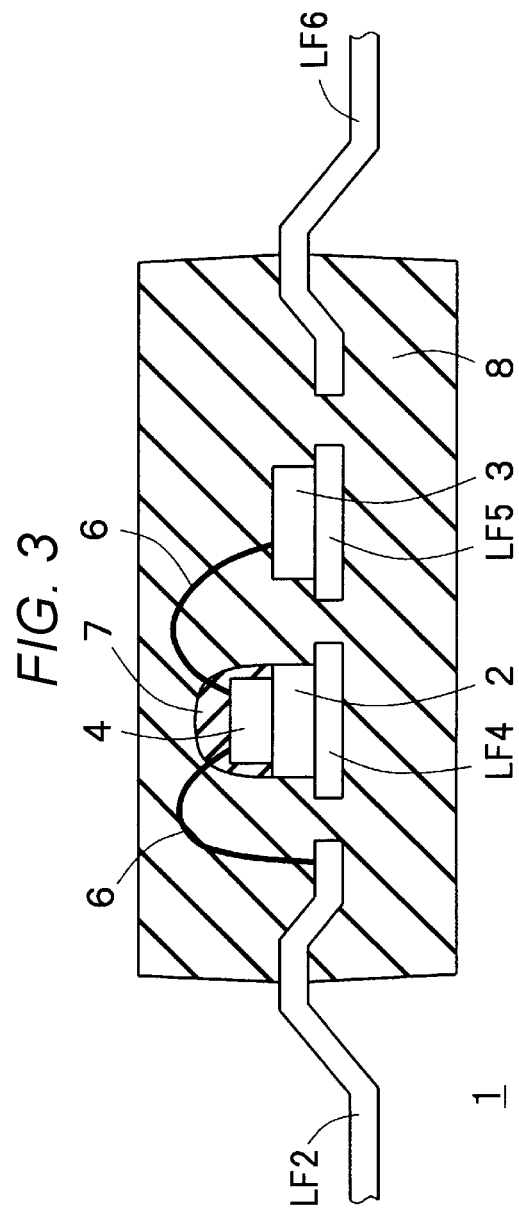
FIG. 3 is a cross-sectional view taken along line A-A of FIG. 2.

Light from the first light emitting chip 4 received by the first light receiving chip 2 via a short light path between these two elements (in a vertical direction in FIG. 3). Thereby, light from the first light emitting chip 4 can be received by the first light receiving chip 2 without substantial light leakage, and thus optical coupling characteristics are improved. The same is true of the second light emitting chip 5 arranged on the second light receiving chip 3.

As described above, the first light emitting chip 4 is arranged in the first region 2a1 of the first light receiving chip 2, and the second light emitting chip 5 is arranged in the fourth region 3a2 of the second light receiving chip 3. That is, the first light emitting chip 4 and the second light emitting chip 5 are arranged on a diagonal across the upper surfaces of the first light receiving chip 2 and the second light receiving chip 3 with respect to each other. Similarly, the first light emitting chip 4 and the second light emitting chip 5 are arranged on a diagonal, which as noted above, can reduce the length of bonding wire(s) 6 and also limits crosstalk by increasing the distance between the first light emitting chip 4 and the second light emitting chip 5. Here, the term "crosstalk" as used herein refers to, for example, a phenomenon in which light from a light emitting chip other than the intended (coupled) light emitting chip is received by a light receiving chip.

The first connection portion 9 on the first light receiving chip 2 is connected to the second light emitting chip 5 by one or more bonding wires 6. Similarly, the second connection portion 10 on the second light receiving chip 3 is connected to the first light emitting chip 4 by one or more bonding wires 6. These bonding wires 6 are arranged substantially in parallel with each other. The length of each of the bonding wires 6 depends on the interval d between the first light receiving chip 2 and the second light receiving chip 3. In the present embodiment, the first light receiving chip 2, the second light receiving chip 3, the first light emitting chip 4, and the second light emitting chip 5 are arranged to limit the required lengths of the bonding wire(s) 6.

Also, as illustrated in FIG. 2, the first light receiving chip 2 and the second light receiving chip 3 may be arranged such that connection points for bonding wires 6 are slightly shifted relative to each other in the second direction y. In this case, bonding wires 6 are arranged obliquely with respect to the first direction x, and the length of the bonding wire 6 is increased to some extent.

In addition, as the interval d mentioned above becomes smaller, the bonding wire 6 can be made shorter. Accordingly, it is preferable that the interval d is made smaller, though this is true only to the extent that the crosstalk is not significantly increased by the reduced distance between elements. When the bonding wire 6 is short, disconnection of the bonding wire or a short circuit is less likely to occur, which in turn allows the device package to be made smaller.

However, as noted, when the interval d becomes smaller, there is a tendency for crosstalk to increase. Accordingly, it is preferable in practice that the interval d be determined in consideration of the length of the bonding wire 6, the device package size, and the crosstalk tolerance of the device.

As illustrated in FIG. 2, the first connection portion 9 includes a wire connection portion WC6 connected to an anode 5a on the second light emitting chip 5 and a wire connection portion WC5 connected to a cathode 5k on the second light emitting chip 5. Wire connection portions WC1 to WC4 are also arranged on the upper surface of the first light receiving chip 2. The wire connection portions WC1 to WC6 are arranged in the second region 2a2. As depicted in FIG. 2, the wire connection portions WC1 to WC6 are in three rows spaced from each other along the second direction y and in two columns spaced from each other along the first direction x. The wire connection portions WC1 to WC3 in one column in proximity to lead frames LF1 to LF3, and the wire connection portions WC4 to WC6 in a second column in proximity to the second light receiving chip 3.

Similarly, the second connection portion 10 includes a wire connection portion WC12 connected to an anode 4a on the first light emitting chip 4, and a wire connection portion WC11 connected to a cathode 4k on the first light emitting chip 4. In addition, wire connection portions WC7 to WC10 are arranged on the upper surface (third region 3a1) of the second light receiving chip 3. The wire connection portions WC7 to WC12 are arranged in the third region 3a1. As depicted in FIG. 2, the wire connection portions WC7 to WC12 are in three rows spaced from each other along the second direction y and in two columns spaced from each other along the first direction x. The wire connection portions WC7 to WC9 are in one column in proximity to lead frames LF6 to LF8, and the wire connection portions WC10 to WC12 are in a second column in proximity to the first light receiving chip 2.

The wire connection portion WC6 is connected to an anode 5a of the second light emitting chip 5 through a bonding wire 6. The wire connection portion WC5 is connected to a cathode 5k of the second light emitting chip 5 through a bonding wire 6. Similarly, the wire connection portion WC12 is connected to the anode 4a through a bonding wire 6. The wire connection portion WC11 is connected to the cathode 4k through a bonding wire 6.

In this manner, in the present embodiment, the bonding wires 6 that are connected to the anode 4a and the cathode 4k are connected to second connection portions 10 (wire connection portions WC12 and WC11, respectively) which are arranged to be in close proximity to each other in the first direction x. Similarly, the bonding wires 6 connected to the anode 5a and the cathode 5k of the second light emitting chip 5 are connected to the first connection portion 9 (wire connection portions WC6 and WC5, respectively) which are also arranged to be in close proximity to each other.

Since the wire connection portions WC6 and WC5 on the first light receiving chip 2 are arranged to face the second light emitting chip 5 across the first direction x, a distance between the wire connection portion and each of the anode 5a and the cathode 5k of the second light emitting chip 5 is reduced, and thus it is possible to reduce the length of the bonding wires 6. Similarly, since the wire connection portions WC12 and WC11 on the second light receiving chip 3 are arranged to face the first light emitting chip 4, a distance between the wire connection portion and each of the anode 4a and the cathode 4k of the first light emitting chip 4 is reduced, and thus it is possible to reduce the length of the bonding wires 6.

Four wire connection portions WC1 to WC4 are connected to the different lead frames LF1 to LF4, respectively, through different bonding wires 6.

In this particular embodiment, the lead frame LF1 supplies a power supply voltage VDD1 for the first light receiving chip 2 and the first light emitting chip 4, and is connected to the wire connection portion (fifth wire connection portion) WC1 through a bonding wire 6. Here, the lead frame LF2 transmits an output signal VO1 of the first light receiving chip 2, and is connected to the wire connection portion (sixth wire connection portion) WC2 through a bonding wire 6. Additionally, the lead frame LF3 supplies an input signal VI2 of the second light emitting chip 5, and is connected to the wire connection portion (seventh wire connection portion) WC3 through a bonding wire 6. The lead frame LF4 sets a ground potential GND1 for the first light receiving chip 2 and the first light emitting chip 4, and is connected to the wire connection portion (eighth wire connection portion) WC4 through a bonding wire 6.

In addition, in this example, the lead frame LF5 supplies a power supply voltage VDD2 for the second light receiving chip 3 and the second light emitting chip 5, and is connected to the wire connection portion (ninth wire connection portion) WC10 through a bonding wire 6. Furthermore, the lead frame LF6 supplies an input signal VI1 for the first light emitting chip 4, and is connected to the wire connection portion (eleventh wire connection portion) WC9 through a bonding wire 6. In this example, the lead frame LF7 transmits an output signal VO2 of the second light receiving chip 3, and is connected to the wire connection portion (tenth wire connection portion) WC8 through a bonding wire 6. Here, the lead frame LF8 sets a ground potential GND2 for the second light receiving chip 3 and the first light emitting chip 4, and is connected to the wire connection portion (twelfth wire connection portion) WC7 through a bonding wire 6.

In this manner, the wire connection portion WC1 of the first light receiving chip 2 illustrated in FIG. 2 is a power terminal, the wire connection portion WC2 is an output terminal, the wire connection portion WC3 is an input terminal, the wire connection portion WC4 is a ground terminal, the wire connection portion WC5 is a cathode connection terminal of the second light emitting chip 5, and the wire connection portion WC6 is an anode connection terminal of the second light emitting chip 5. The lead frames LF1 to LF4 are arranged in proximity to the wire connection portions WC1 to WC4, and the second light emitting chip 5 is arranged in proximity to the first light receiving chip 2, thereby allowing the length of each of the bonding wires 6 to be reduced. Similarly, the wire connection portion WC7 is a ground terminal of the second light receiving chip 3, the wire connection portion WC8 is an output terminal, the wire connection portion WC9 is an input terminal, the wire connection portion WC10 is a power terminal, the wire connection portion WC11 is a cathode connection terminal of the first light emitting chip 4, and the wire connection portion WC12 is an anode connection terminal of the first light emitting chip 4. The lead frames LF5 to LF8 are arranged in proximity to the wire connection portions WC7 to WC10, and the first light emitting chip 4 is arranged in proximity to the second light receiving chip 3, thereby allowing the length of each of the bonding wires 6 to be reduced.

FIG. 3 is a cross-sectional view taken along line A-A of FIG. 2. The surface of the first light emitting chip 4 arranged on the first light receiving chip 2 with the light emitting surface thereof facing downward and a portion of the bonding wire 6 are covered with a first resin portion 7 formed of a transparent silicone material. In addition, the surface of the first resin portion 7 is covered with a second resin portion 8 that shields outside light. The lead frames LF1 to LF8 extend between the outside and the inside of the second resin portion 8 (packaging resin). Meanwhile, FIG. 2 illustrates an example in which the package of the optical coupling device 1 has a dual inline package (DIP) shape. However, the package may have a single inline package (SIP) shape, a small outline package (SOP) shape, or the like, and the shape of the package is arbitrary.

In FIG. 2, the lead frame LF4 is set as a ground potential GND1, and the lead frame LF5 is set as a power supply voltage VDD2. When a ground potential has a tendency to be affected by noise, it is preferable that a lead frame set as a ground potential is configured to have a large width. Consequently, FIG. 4 is a diagram illustrating a layout in which lead frames LF4 and LF8 respectively having wide portions LF4a and LF8a adjacent to each other in the x-direction are set as ground potentials GND1 and GND2, respectively, according to a first modification example of FIG. 2.

Figure 4:
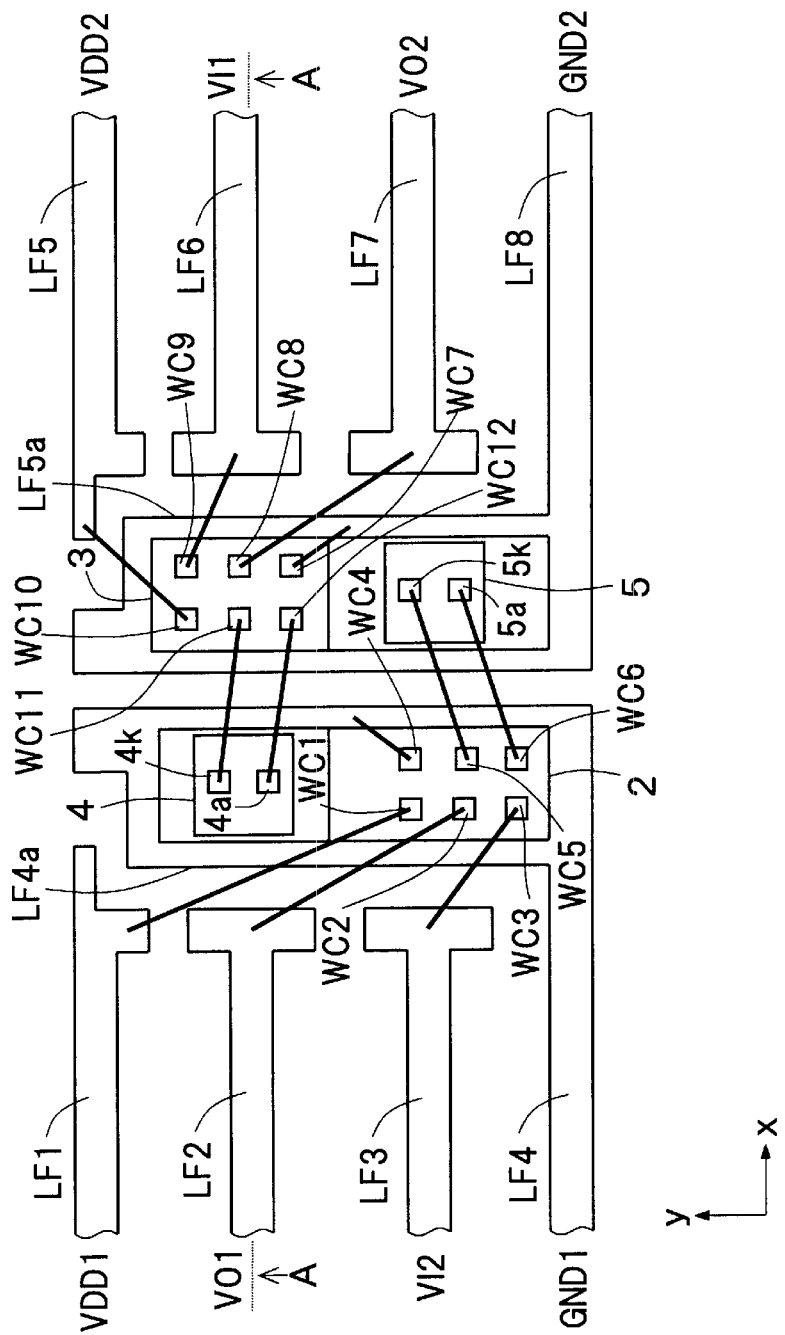
FIG. 4 is a diagram illustrating a layout according to a first modification example of FIG. 2.

The arrangement of a first light receiving chip 2 and a first light emitting chip 4 in the second direction y on the wide portion LF4a of a lead frame LF1 of FIG. 4 is opposite to that in the lead frame LF1 of FIG. 2—that is, first light emitting chip 4 in FIG. 4 is on the far end of first light receiving chip 2 from the terminal end portion of lead frame LF4 in the second direction y. Similarly, the arrangement of a second light receiving chip 3 and a second light emitting chip 5 in the second direction y in the wide portion LF8a of the lead frame LF8 of FIG. 4 is opposite to that on the lead frame LF5 of FIG. 2.

However, connection destinations of respective bonding wires 6 connected to wire connection portions WC1 to WC6 on the first light receiving chip 2 and wire connection portions WC7 to WC12 on the second light receiving chip 3 are the same as those in FIG. 2.

Also in the case of FIG. 4, the lead frames LF1 to LF4 are arranged in proximity to the wire connection portions WC1 to WC4, and the second light emitting chip 5 is arranged in proximity to the first light receiving chip 2, thereby allowing the length of each of the bonding wires 6 to be reduced. Similarly, the lead frames LF5 to LF8 are arranged in proximity to the wire connection portions WC7 to WC10, and the first light emitting chip 4 is arranged in proximity to the second light receiving chip 3, thereby allowing the length of each of the bonding wires 6 to be reduced.

Figure 5:
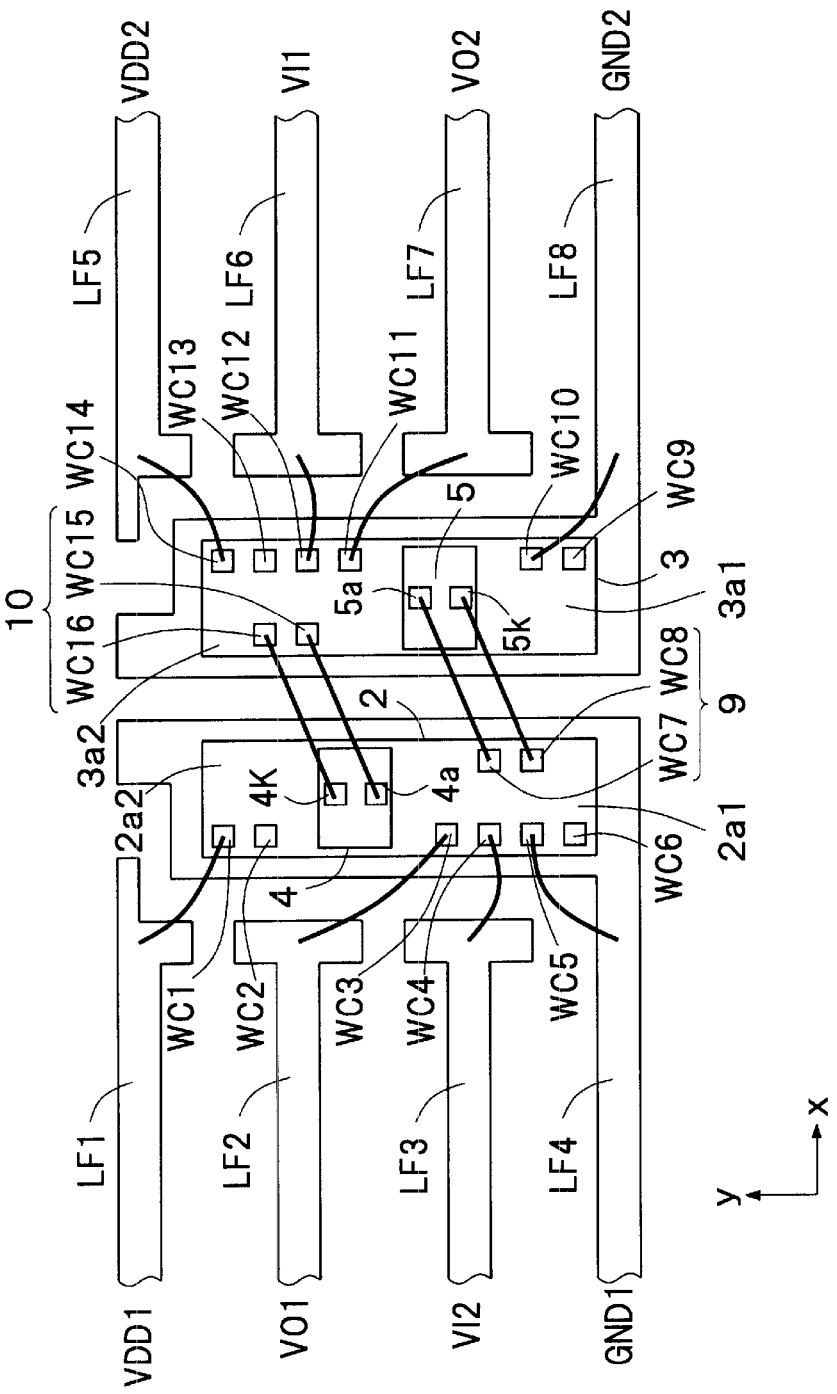
FIG. 5 is a diagram illustrating a layout of an optical coupling device including wire connection portions arranged in a manner different from those of FIG. 2, according to a second modification example.

FIG. 2 illustrates an example in which the wire connection portions WC1 to WC6 are provided on the upper surface of the first light receiving chip 2 in two columns spaced in the first direction x and the wire connection portions WC7 to WC12 are provided on the upper surface of the second light receiving chip 3 in three rows spaced in the second direction y, but the particular arrangement of these wire connection portions is not limited to that illustrated in FIG. 2. FIG. 5 is a diagram illustrating a layout of an optical coupling device 1 according to a second modification example. The first light receiving chip 2 and the second light receiving chip 3 within the optical coupling device 1 of FIG. 5 include wire connection portions WC1 to WC12 which are arranged in a manner that is different from that of FIG. 2.

The first light receiving chip 2 of FIG. 5 includes six wire connection portions WC1 to WC6 are lined up on the upper surface of 2a in the second direction y along an edge of the upper surface 2a proximate to the lead frames LF1 to LF4 in the first direction x, and a first connection portion 9 which is arranged on the side of the second light receiving chip 3 and includes two wire connection portions WC7 and WC8 lined up in the second direction y. The second light receiving chip 3 includes six wire connection portions WC9 to WC14 which are arranged on the side edge of the upper surface 3a nearest the lead frames LF5 to LF8 and are lined up in the second direction y, and a second connection portion 10 which is arranged on the side edge of the upper surface 3a nearest the first light receiving chip 2 and includes two wire connection portions WC15 and WC16 lined up in the second direction y. In FIG. 2, the wire connection portions WC1 to WC6 on the first light receiving chip 2 are arranged in the second region 2a2 on the first light receiving chip 2 on the other end side in the second direction y. On the other hand, in FIG. 5, the wire connection portions WC1 and WC2 are arranged in a second region 2a2 together with the first light emitting chip 4, and the wire connection portions WC3 to WC6 are arranged in a first region 2a1. In this manner, the wire connection portions WC1 to WC6 are arranged in a state of being distributed to the first region 2a1 and the second region 2a2. Similarly, in FIG. 5, the wire connection portions WC9 and WC10 on the second light receiving chip 3 are arranged in a third region 3a1 together with the second light emitting chip 5, and the wire connection portions WC11 to W14 are arranged in a fourth region 3a2. In this manner, the wire connection portions WC9 to WC14 are distributed in the third region 3a1 and the fourth region 3a2.

In FIG. 5, the anode 4a and the cathode 4k (on first light emitting chip 4) and connection portions WC15 and WC16 (in fourth region 3a2) are arranged to face each other across the first direction x . Similarly, the anode 5a and the cathode 5k (on the second light emitting chip 5) and the wire connection portions WC7 and WC8 (in first region 2a1) are arranged to face each other across the first direction x.

Similarly in FIG. 5, the lead frames LF1 to LF4 are arranged in proximity to the wire connection portions WC1 to WC6, and the second light emitting chip 5 is arranged in proximity to the wire connection portions WC7 and WC8, thereby allowing the length of each of the bonding wires 6 to be reduced. Similarly, the lead frames LF5 to LF8 are arranged in proximity to the wire connection portions WC9 to WC14, and the first light emitting chip 4 is arranged in proximity to the wire connection portions WC15 and WC16, thereby allowing the length of each of the bonding wires 6 to be reduced.

Also in FIG. 5, in a similar manner as depicted in FIG. 2, it is possible to reduce length of the bonding wires 6 and to achieve a reduction in the size of the package and crosstalk.

FIGS. 1 to 5 illustrate an example of the bidirectional 2-channel optical coupling device 1 having a 1:1 configuration in which the first and second side surfaces 2b and 3b face each other across the first direction x. Here, the phrase "1:1 configuration" refers to a configuration in which one lead frame LF3 (for an input signal) and one lead frame LF4

(for an output signal) are provided on a side of the package of the optical coupling device 1, and one lead frame LF8 (for an input signal) and one lead frame LF9 (for an output signal) are provided on a different side of the package of the optical coupling device 1. The present disclosure can also be applied to embodiments of an optical coupling device 1 having three or more channels.

Figure 6:
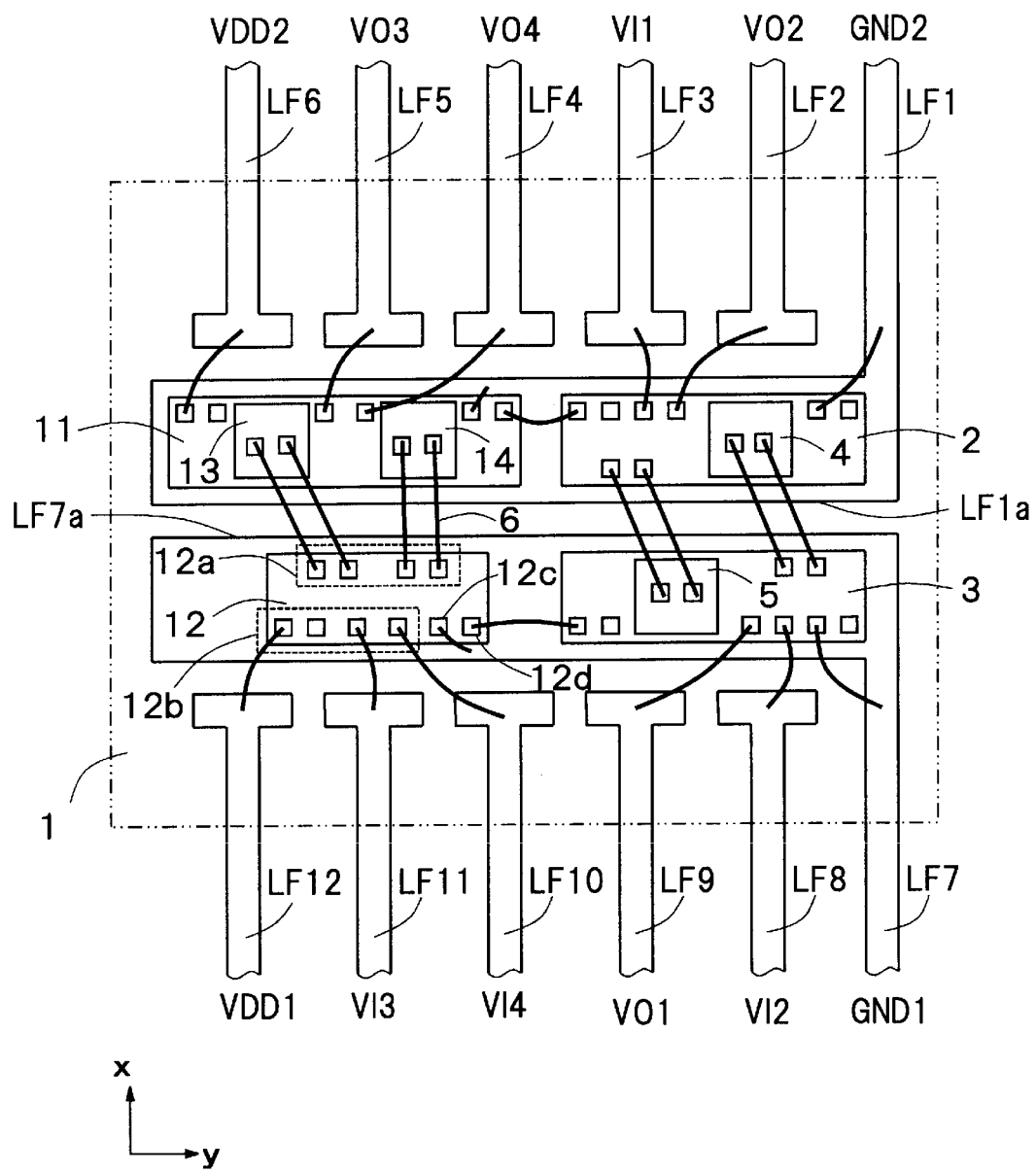
FIG. 6 is a diagram illustrating a layout of a bidirectional 4-channel optical coupling device having a 1:3 configuration according to a third modification example.

FIG. 6 is a diagram illustrating a layout of an optical coupling device 1 according to a third modification example. FIG. 6 is a diagram illustrating a layout of a bidirectional 4-channel optical coupling device 1 having a 1:3 configuration. Here, the phrase "1:3 configuration" refers to a configuration in which one lead frame LF3 (for an input signal) and three lead frames LF2, LF4, and LF5 (for an output signal) are provided on a side of the package of the optical coupling device 1, and three lead frames LF8, LF10, and LF11 (for an input signal) and one lead frame LF9 (for an output signal) are provided on a different side of the package of the optical coupling device 1.

The optical coupling device 1 illustrated in FIG. 6 includes twelve (six on each side) lead frames (LF1 to LF12). The lead frames LF1 and LF7 each include wide a portion (LF1a and LF7a, respectively) extending along a second direction y from a terminal end portion of the respective lead frames LF1 and LF7 that extends along the first direction x. The wide portions are arranged in proximity to each other across the first direction x. A first light receiving chip 2 and a third light receiving chip 11 are mounted on the wide portion LF1a of the lead frame LF1. A second light receiving chip 3 and a first chip 12 are mounted on the wide portion LF7a of the lead frame LF7.

The first light receiving chip 2 and the second light receiving chip 3 have substantially the same configurations as those of the first light receiving chip 2 and the second light receiving chip 3 illustrated in FIG. 5, and a configuration in which a first light emitting chip 4 and a second light emitting chip 5 are arranged on the respective first and second light receiving chips and a connection configuration of a bonding wire 6 are also similar to those in FIG. 5.

Two light emitting chips (a third light emitting chip 13 and a fourth light emitting chip 14) are arranged on the third light receiving chip 11. The bonding wires 6 connected to respective anodes and cathodes of the two light emitting chips 13 and 14 are connected to a wire connection portion 12a on the first chip 12. In addition, the first chip 12 includes wire connection portions 12b, 12c, and 12d. Terminals within the wire connection portion 12b are respectively connected to the lead frames LF10 to LF12 by bonding wires 6. The wire connection portion 12c is connected to the lead frame LF7 through a bonding wire 6. The wire connection portion 12d is connected to the third light emitting chip 13 through a bonding wire 6.

The wire connection portion 12a on the first chip 12 includes terminals connected to the anodes and the cathodes of the third light emitting chip 13 and the fourth light emitting chip 14. Accordingly, the wire connection portion 12a is arranged in proximity to the third light emitting chip 13 and the fourth light emitting chip 14, and thus it is possible to reduce the required length of each of the bonding wires 6 connecting between the wire connection portion 12a and the third light emitting chips 13 and 14.

In addition, the wire connection portion 12b on the first chip 12 includes a power terminal and input terminals for the third light emitting chip 13 and the fourth light emitting chip 14. Accordingly, the lead frame LF12 for a power terminal and the lead frames LF10 and LF11 for an input terminal are arranged in the vicinity of the wire connection portion 12b, and thus it is possible to reduce the length of each of the bonding wires 6 for connecting the wire connection portion 12b and the lead frames LF10 to LF12.

FIG. 6 illustrates an example in which two light receiving chips 2 and 11 are arranged in the wide portion LF1a of the lead frame LF1, but the number of light receiving chips arranged in one wide portion is not particularly limited to this number. In addition, a plurality of signals may be transmitted using a plurality of optical coupling devices 1 for which packages are different from each other.

Figure 7:
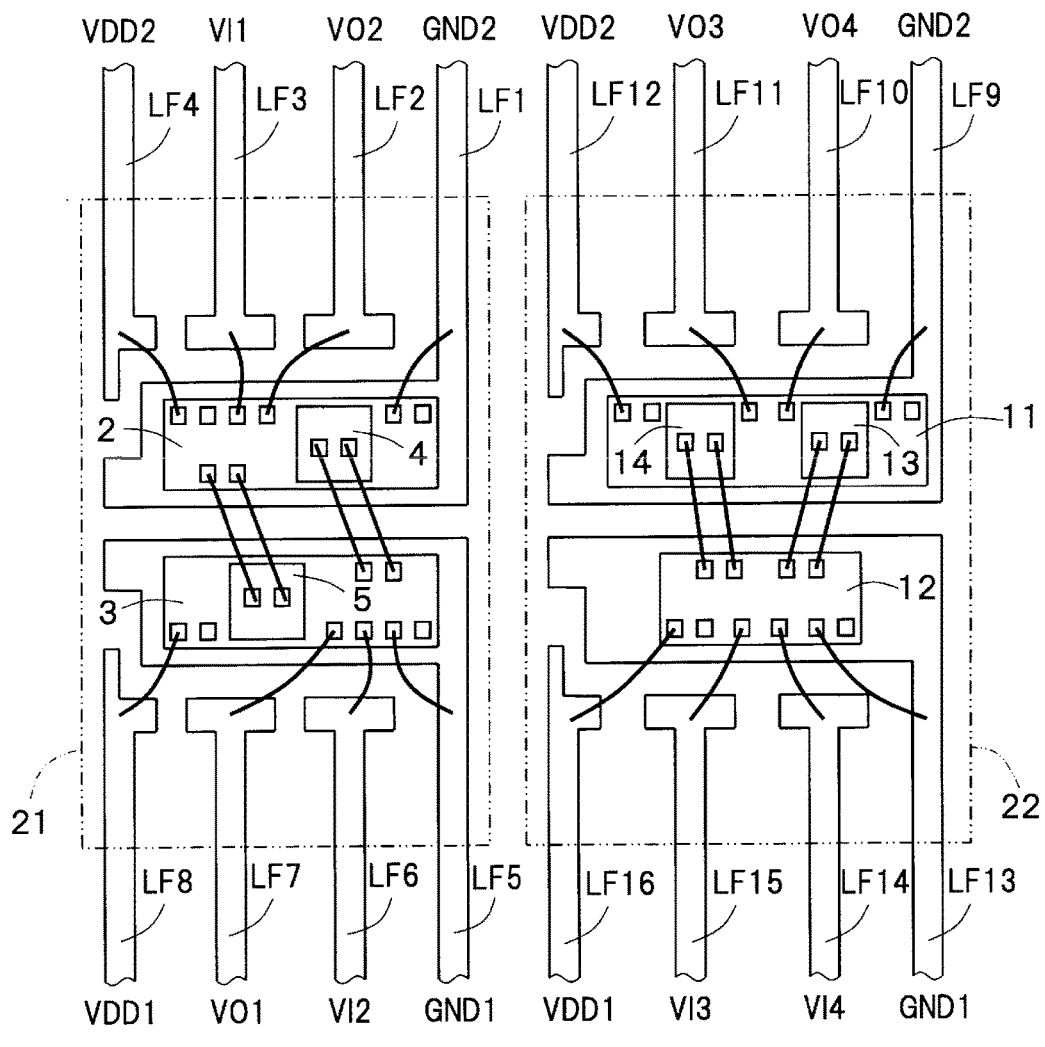
FIG. 7 is a diagram illustrating a layout of an optical coupling device in which a third light receiving chip and a first chip which are located on the left side of FIG. 6 are integrated into another package, according to a fourth modification example.

For example, FIG. 7 is a diagram illustrating layouts of optical coupling devices 21 and 22 according to a fourth modification example. FIG. 7 illustrates an example in which the third light receiving chip 11 and the first chip 12 on the left side of FIG. 6 are configured in optical coupling devices 21 and 22 which are separate packages. In FIG. 7, the outlines of the packages of the two optical coupling devices 21 and 22 are indicated by a dashed line. FIG. 7 illustrates an example in which a 1:3 channel configuration is achieved by providing two types of optical coupling devices 21 and 22 having different layouts. In the case of FIG. 7, in spite of a necessity to provide two different types of optical coupling devices (e.g., 21 and 22), a similar overall layout of chips as that depicted in FIG. 6 is obtained, which allows the length of the required bonding wires 6 to be reduced in both the optical coupling devices 21 and 22, though an increase in the total number of lead frame elements (terminals) is required. In addition, the two types of optical coupling devices 21 and 22 can be arbitrarily combined with each other, and thus it is possible to achieve an optical coupling device 1 having various configurations each for which the arrangement of an input signal pin is different.

In this manner, in the present embodiment including FIGS. 1 to 7 described above, the first and second side surfaces 2b and 3b of the respective first and second light receiving chips 2 and 3 are arranged closely to face each other across the first direction x, the first light emitting chip 4 is arranged in the first region 2a1 on the first light receiving chip 2 on one end side in the second direction y, and the second light emitting chip 5 is arranged in the fourth region 3a2 on the second light receiving chip 3 on the other end side in the second direction y, and thus it is possible to reduce the length of the bonding wire 6 for connecting the first light receiving chip 2 and the second light emitting chip 5 and the length of the bonding wire 6 for connecting the second light receiving chip 3 and the first light emitting chip 4. That is, in the present embodiment, the bonding wires 6 for connecting the anodes and the cathodes of the first light emitting chip 4 and the second light emitting chip 5 are connected to the second light receiving chip 3 and the first light receiving chip 2 which are arranged in proximity to each other, and thus the bonding wire 6 may be short. Accordingly, the disconnection of the bonding wire 6 or a short circuit is less likely to occur.

In addition, according to the present embodiment, the first light emitting chip 4 and the second light emitting chip 5 are arranged on a diagonal on the upper surfaces of the first light receiving chip 2 and the second light receiving chip 3. Accordingly, even when the first light receiving chip 2 and the second light receiving chip 3 are arranged in proximity to each other, it is possible to secure a relatively long distance between the first light emitting chip 4 and the second light emitting chip 5. Thereby, it is possible to reduce the occurrence of crosstalk, and thus signal reliability is improved. In other words, even when the first light receiving chip 2 and the second light receiving chip 3 are arranged in proximity to each other in the first direction x, significant crosstalk is will not be expected to occur, and thus it is possible to reduce the size of the package of the optical coupling device 1.

As the device package becomes larger, there is an increasing tendency for variations to occur within the package as stresses are applied, and thus there is a tendency for the light emitting chip or the light receiving chip to be peeled from each other. Thereby, according to the present embodiment, the light emitting chip or the light receiving chip are less likely to be peeled from each other because the device package size can be reduced.

Further, in the present embodiment, the first and second side surfaces 2b and 3b of the respective rectangular first and second light receiving chips 2 and 3 are arranged to closely face each other, and thus it is possible to reduce the bonding wire 6 lengths necessary for connecting the first light receiving chip 2 and the second light receiving chip 3.

In this manner, since the length of the bonding wire 6 can be reduced, it is possible to prevent the disconnection or r short circuiting, and thus the reliability of the optical coupling device 1 is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. An optical coupling device, comprising:
   a first light receiving chip having a first upper surface and a first side surface, the first upper surface including a first region on a first end portion and a second region on a second end portion opposite the first end portion in a first direction;
   a second light receiving chip having a second upper surface and a second side surface, the second upper surface including a third region on a first end portion and a fourth region on a second end portion opposite the first end portion in the first direction, the third region being adjacent the first region in a second direction crossing the first direction, and the first and second side surfaces facing each other in the second direction,
   a first light emitting chip disposed on the first region;
   a second light emitting chip disposed on the fourth region;
   a first connection portion disposed on the second region and electrically connected to the second light emitting chip through a bonding wire; and
   a second connection portion disposed on the third region and electrically connected to the first light emitting chip through a bonding wire.

2. The device according to claim 1, wherein
   the first connection portion is aligned in the second direction with the second light emitting chip, and
   the second connection portion is aligned in the second direction with the first light emitting chip.

3. The device according to claim 2, wherein the first connection portion includes:
   a first wire connection pad that is connected to an anode of the second light emitting chip via a bonding wire, and
   a second wire connection pad that is connected to a cathode of the second light emitting chip via a bonding wire, and the second connection portion includes:
   a third wire connection pad that is connected to an anode of the first light emitting chip via a bonding wire, and
   a fourth wire connection pad that is connected to a cathode of the first light emitting chip via a bonding wire.

4. The device according to claim 3, wherein the first light receiving chip includes:
   a fifth wire connection pad configured to receive a power supply voltage to be supplied to the first light receiving chip and the first light emitting chip,
   a sixth wire connection pad configured to output an output signal from the first light receiving chip,
   a seventh wire connection pad configured to receive an input signal to be supplied to the second light emitting chip, and
   an eighth wire connection pad configured to connect to a ground potential to be supplied to the first light receiving chip and the first light emitting chip, and the second light receiving chip includes:
   a ninth wire connection pad configured to receive a power supply voltage to be supplied to the second light receiving chip and the second light emitting chip,
   a tenth wire connection pad configured to output an output signal supplied from the second light receiving chip,
   an eleventh wire connection pad configured to receive an input signal to be supplied to the first light emitting chip, and
   a twelfth wire connection pad configured to connect to a ground potential to be supplied to of the second light receiving chip and the second light emitting chip.

5. The device according to claim 4, wherein
   the fifth to eighth wire connection pads are within the second region, and
   the ninth to twelfth wire connection pads are within the third region.

6. The device according to claim 4, wherein
   the fifth to eighth wire connection pads are within the first region and the second region, and
   the ninth to twelfth wire connection pads are within the third region and the fourth region.

7. The device according to claim 1, wherein the first connection portion includes:
   a first wire connection pad that is connected to an anode of the second light emitting chip via a bonding wire, and
   a second wire connection pad that is connected to a cathode of the second light emitting chip via a bonding wire, and the second connection portion includes:
   a third wire connection pad that is connected to an anode of the first light emitting chip via a bonding wire, and
   a fourth wire connection pad that is connected to a cathode of the first light emitting chip via a bonding wire.

8. The device according to claim 7, wherein the first light receiving chip includes:
   a fifth wire connection pad configured to receive a power supply voltage to be supplied to the first light receiving chip and the first light emitting chip,
   a sixth wire connection pad configured to output an output signal from the first light receiving chip,
   a seventh wire connection pad configured to receive an input signal to be supplied to the second light emitting chip, and an eighth wire connection pad configured to connect to a ground potential to be supplied to the first light receiving chip and the first light emitting chip, and the second light receiving chip includes:
a ninth wire connection pad configured to receive a power supply voltage to be supplied to the second light receiving chip and the second light emitting chip,
a tenth wire connection pad configured to output an output signal supplied from the second light receiving chip,
an eleventh wire connection pad configured to receive an input signal to be supplied to the first light emitting chip, and
a twelfth wire connection pad configured to connect to a ground potential to be supplied to of the second light receiving chip and the second light emitting chip.

9. The device according to claim 8, wherein
the fifth to eighth wire connection pads are within the second region, and
the ninth to twelfth wire connection pads are within the third region.

10. The device according to claim 8, wherein the fifth to eighth wire connection pads are within the first region and the second region, and
the ninth to twelfth wire connection pads are within the third region and the fourth region.

11. An optical coupling device, comprising:
a first light receiving chip having a first lower surface facing a first lead frame portion and a first upper surface opposite the first lower surface in a first direction;
a first light emitting chip disposed on a first region of the first upper surface;
a first plurality of bonding pads disposed on a second region of the first upper surface, the first and second regions being adjacent in a second direction crossing the first direction;
a second light receiving chip having a second lower surface facing a second lead frame portion and a second upper surface opposite the second lower surface in the first direction;
a second light emitting chip disposed on a third region of the second upper surface;
a second plurality of bonding pads disposed on a fourth region of the second upper surface, the third and fourth regions being adjacent in the second direction;
a first bonding wire connected to a first bonding pad in the first plurality of bonding pads and an anode terminal of the second light emitting chip;
a second bonding wire connected to a second bonding pad in the first plurality of bonding pads and a cathode terminal of the second light emitting chip;
a third bonding wire connected to a first bonding pad in the second plurality of bonding pads and an anode terminal of the first light emitting chip; and
a fourth bonding wire connected to a second bonding pad in the second plurality of bonding pads and a cathode terminal of the first light emitting chip, wherein
the first and second lead frame portions are spaced from each other in a third direction crossing the first and second directions,
the first and fourth regions are adjacent in the third direction, and
the second and third regions are adjacent in the third direction.

12. The optical coupling device according to claim 11, wherein the first, second, third, and fourth bonding wires extend in a substantially parallel direction with each other.

13. The optical coupling device according to claim 11, wherein the first and second bonding wires extend in a substantially parallel direction with each other.

14. The optical coupling device according to claim 11, wherein the third and fourth bonding wires extend in a substantially parallel direction with each other.

15. The optical coupling device according to claim 11, wherein
the first and second bonding wires extend in parallel with each other along a fourth direction, and
the third and fourth bonding wires extend in parallel along a fifth direction that crosses the fourth direction.

16. The optical coupling device according to claim 11, further comprising a third plurality of bonding pads disposed on a fifth region of the first upper surface, the first region being between the second and fifth regions in the second direction.

17. The optical coupling device according to claim 16, further comprising a fourth plurality of bonding pads disposed on a sixth region of the second upper surface, the third region being the fourth and sixth regions in the second direction.

18. An optical coupling device, comprising:
a first plurality of lead frame portions having a terminal end extending from a first side of a packaging resin;
a second plurality of lead frame portions having a terminal end extending from a second side of the packaging resin;
a first light receiving chip mounted on a first end portion of a first lead frame portion in the first plurality of lead frame portions, the first end portion being within the packaging resin;
a first light emitting chip mounted on a first region of a first upper surface of the first light receiving chip;
a first plurality of bonding pads disposed on a second region of the first upper surface, the first and second regions being adjacent on the first upper surface in a first direction;
a second light receiving chip mounted on a second end portion of a second lead frame portion in the second plurality of lead frame portions, the second end portion being within the packaging resin;
a second light emitting chip mounted on a third region of a second upper surface of the second light receiving chip;
a second plurality of bonding pads disposed on a fourth region of the second upper surface, the third and fourth regions being adjacent on the second upper surface in the first direction;
a first bonding wire extending in a second direction crossing the first direction and connected to a first bonding pad in the first plurality of bonding pads and an anode terminal of the second light emitting chip;
a second bonding wire extending in the second direction and connected to a second bonding pad in the first plurality of bonding pads and a cathode terminal of the second light emitting chip;
a third bonding wire extending in a third direction crossing the first direction and connected to a first bonding pad in the second plurality of bonding pads and an anode terminal of the first light emitting chip; and
a fourth bonding wire extending in the third direction and connected to a second bonding pad in the second plurality of bonding pads and a cathode terminal of the first light emitting chip, wherein the first and fourth regions are adjacent in the second direction across a space between the first and second lead frame portions, and the second and third regions are adjacent in the third direction across the space between the first and second lead frame portions.

19. The optical coupling device according to claim 18, wherein the second and third directions are crossing.

20. The optical coupling device according to claim 18, wherein a fifth bonding wire is connected to a third bonding pad in the first plurality of bonding pads and the first lead frame portion, and the first lead frame portion is a ground terminal; and a sixth bonding wire is connected to a fourth bonding pad disposed on the first upper surface and a third lead frame portion in the first plurality of lead frame portion, and the third lead frame portion is a power supply terminal.

* * * * *